US012648336B2

(12) United States Patent
Kwon et al.

(10) Patent No.: US 12,648,336 B2
(45) Date of Patent: Jun. 2, 2026

(54) DISPLAY DEVICE INCLUDING MULTI-LAYERED CATHODE ELECTRODE LAYER

(71) Applicant: LG DISPLAY CO., LTD., Seoul (KR)

(72) Inventors: Ohnam Kwon, Paju-si (KR); Jiyoung Ahn, Goyang-si (KR); Tae-Hoon Kim, Goyang-si (KR); Heonseok Lee, Seoul (KR); Yeon Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 494 days.

(21) Appl. No.: 18/303,242

(22) Filed: Apr. 19, 2023

(65) Prior Publication Data

US 2024/0224712 A1     Jul. 4, 2024

(30) Foreign Application Priority Data

Dec. 29, 2022     (KR) ........................ 10-2022-0189852

(51) Int. Cl.
  *H10K 59/80* (2023.01)
  *H10K 50/842* (2023.01)
  *H10K 59/131* (2023.01)
(52) U.S. Cl.
  CPC ..... *H10K 59/80523* (2023.02); *H10K 59/873* (2023.02); *H10K 50/8426* (2023.02); *H10K 59/131* (2023.02)
(58) Field of Classification Search
  CPC .............. H10K 50/824; H10K 50/844; H10K 50/8426; H10K 59/80523; H10K 59/873; H10K 59/131; H10K 59/38
  See application file for complete search history.

(56) References Cited

U.S. PATENT DOCUMENTS

| | | | |
|---|---|---|---|
| 10,553,808 B2 | 2/2020 | Kwon et al. | |
| 2002/0180349 A1* | 12/2002 | Aziz ..................... | H10K 50/826 |
| | | | 313/506 |
| 2006/0255720 A1* | 11/2006 | Hirai .................... | H10K 71/135 |
| | | | 313/503 |
| 2010/0181557 A1* | 7/2010 | Sun .................. | H10K 59/80524 |
| | | | 257/40 |
| 2015/0188077 A1* | 7/2015 | Kim ..................... | H10K 59/122 |
| | | | 438/46 |

(Continued)

FOREIGN PATENT DOCUMENTS

| | | | | |
|---|---|---|---|---|
| KR | 20020069319 A | * | 8/2002 | ............. H05B 33/26 |
| KR | 10-2016-0069555 A | | 6/2016 | |
| KR | 10-2018-0025060 A | | 3/2018 | |

*Primary Examiner* — Ida M Soward
(74) *Attorney, Agent, or Firm* — Fenwick & West LLP

(57) ABSTRACT

A display device includes a substrate; an organic light-emissive layer disposed on the substrate; and a cathode electrode layer disposed on the organic light-emissive layer, wherein the cathode electrode layer includes: a first electrode layer disposed on the organic light-emissive layer; a second electrode layer disposed on the first electrode layer; and a third electrode layer disposed on the second electrode layer, wherein the second electrode layer is a conductive organic material layer. The second electrode layer can absorb heat from laser to reduce damage to the third electrode layer. Thus, penetration of external defect-causing factors into the organic light-emissive layer through the third electrode layer can be reduced.

16 Claims, 9 Drawing Sheets

(56)                    References Cited

U.S. PATENT DOCUMENTS

| | | | |
|---|---|---|---|
| 2016/0164039 A1* | 6/2016 | Im | H10K 85/626 |
| | | | 257/40 |
| 2016/0172616 A1* | 6/2016 | Kim | H10K 59/80521 |
| | | | 438/38 |
| 2018/0062104 A1* | 3/2018 | Kwon | H10K 59/80524 |
| 2023/0110063 A1* | 4/2023 | Kato | H05B 33/26 |
| | | | 257/40 |
| 2023/0209868 A1* | 6/2023 | Park | H10K 59/8731 |
| | | | 257/40 |
| 2023/0217699 A1* | 7/2023 | Ahn | H10K 50/86 |
| | | | 257/91 |

* cited by examiner

1

1

DISPLAY DEVICE INCLUDING MULTI-LAYERED CATHODE ELECTRODE LAYER

CROSS-REFERENCE TO RELATED APPLICATION

This application claims priority from Republic of Korea Patent Application No. 10-2022-0189852 filed on Dec. 29, 2022 in the Korean Intellectual Property Office, which is hereby incorporated by reference in its entirety.

BACKGROUND

Field

The present disclosure relates to a display device, and more particularly, to a display device subjected to a repair process.

Description of Related Art

Display devices are implemented in very diverse forms such as televisions, monitors, smart phones, tablet PCs, laptops, and wearable devices.

An example of the display device may include an organic light-emitting display device (OLED) as a self-luminous display device which is not only advantageous in terms of power consumption due to low voltage operation, but also has excellent advantages in color rendering, a response speed, a viewing angle, and a contrast.

The organic light-emitting display device may include a plurality of pixels defined by gate lines and data lines intersecting with each other.

In this case, in order to drive the plurality of pixels, power lines may be connected thereto such that power may be applied to each pixel.

SUMMARY

In the display device, various components such as a plurality of thin-film transistors, a capacitor, and various signal lines may be formed in multiple layers via various processes.

In a process for manufacturing the display device, a defective pixel operating abnormally may occur due to deterioration of characteristics of the thin-film transistor or occurrence of a short circuit between the various signal lines and between the layers.

When, in this way, a defect occurs in a specific pixel, a repair process on the defective pixel may be performed.

In the repair process on the defective pixel, the defective pixel may be converted to a dark spot and thus may be almost indistinguishable.

Specifically, a laser cutting process may be performed to break electrical connection to the defective pixel in a repair area using laser.

However, when the repair process is performed using the laser, a cathode electrode layer may be damaged by heat of the laser.

A cathode hole may occur in the damaged cathode electrode layer. Through the cathode hole, external defect-causing factors such as gas, moisture, and oxygen can invade an organic light-emissive layer disposed under the cathode electrode layer.

When the external defect-causing factors as described above invade the organic light-emissive layer, the organic light-emissive layer may be deteriorated, and accordingly, a problem may occur in that normal pixels are additionally defective.

Accordingly, the inventors of the present disclosure conducted several experiments capable of reducing the deterioration of the organic light-emissive layer in the repair process of the display device.

Through various experiments, the inventors of the present disclosure have invented a display device capable of reducing damage to the cathode electrode layer during the repair process to reduce the inflow of the external defect-causing factors into the organic light-emissive layer.

A purpose to be achieved according to an embodiment of the present disclosure is to provide a display device including a cathode electrode layer of a robust structure that can reduce the penetration of external defect-causing factors into the organic light-emissive layer even when the laser cutting process is performed.

Further, a purpose to be achieved according to an embodiment of the present disclosure is to provide a display device including a cathode electrode layer having a robust structure capable of providing a normal function even when damage occurs to a portion of the layer.

Further, a purpose to be achieved according to an embodiment of the present disclosure is to provide a display device having a stack structure capable of reducing damage to a cathode electrode layer caused by laser having a specific wavelength.

Further, a purpose to be achieved according to an embodiment of the present disclosure is to provide a display device capable of reducing aperture ratio loss while reducing damage to the cathode electrode layer regardless of laser having a specific wavelength.

Further, a purpose to be achieved according to an embodiment of the present disclosure is to provide a display device with an improved encapsulation function to reduce the inflow of the defect factors from the outside without forming a separate capping layer on top of the cathode electrode layer.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

A display device according to an embodiment of the present disclosure includes a substrate; an organic light-emissive layer disposed on the substrate; and a cathode electrode layer disposed on the organic light-emissive layer, wherein the cathode electrode layer includes: a first electrode layer disposed on the organic light-emissive layer; a second electrode layer disposed on the first electrode layer; and a third electrode layer disposed on the second electrode layer, wherein the second electrode layer is a conductive organic material layer.

Further, in the display device according to an embodiment of the present disclosure, a color filter layer may be disposed between the organic light-emissive layer and a power line or a data line disposed under the organic light-emissive layer in an area corresponding to a repair area.

A display device according to an embodiment of the present disclosure includes a substrate; an organic light-emissive layer disposed on the substrate; and a cathode electrode layer disposed on the organic light-emissive layer,

3 wherein the cathode electrode layer is composed of a plurality of layers including a conductive organic material layer.

According to the embodiments of the present disclosure, the second electrode layer as the conductive organic material layer included in the cathode electrode layer can absorb heat from the laser to reduce damage to the third electrode layer. Thus, the penetration of external defect-causing factors into the organic light-emissive layer through the third electrode layer can be reduced.

Due to the robust structure of the cathode electrode layer, the defect occurrence due to deterioration of the organic light-emissive layer may be reduced, thereby reducing the progressive dark spot defect occurrence in the display device.

In addition, according to an embodiment of the present disclosure, the second electrode layer as the conductive organic material layer included in the cathode electrode layer can absorb heat from the laser to reduce damage to the third electrode layer. Thus, even when the first electrode layer is damaged by the laser, the cathode electrode layer may function normally due to the stack structure of the conductive second electrode layer and the conductive third electrode layer.

Further, in an embodiment of the present disclosure, the color filter layer absorbing the heat of the laser of the specific wavelength may be disposed between the organic light-emissive layer and the power line and/or the data line disposed under the organic light-emissive layer and in an area corresponding to the repair area. Thus, the damage to the cathode electrode layer due to the laser may be reduced.

Further, according to an embodiment of the present disclosure, the robust structure of the cathode electrode layer can effectively absorb the heat of the laser in an entire wavelength range. Thus, the damage to the cathode electrode layer caused by the laser may be reduced even when the color filter layer absorbing the heat of the laser of the specific wavelength so as to reduce the damage to the cathode electrode layer is absent.

Further, even when the color filter layer is not disposed between the organic light-emissive layer and the power line, and/or between the organic light-emissive layer and the data line, the damage to the cathode electrode layer due to the laser may be reduced. Thus, the aperture ratio loss that may occur due to the presence of the color filter layer in an area other than a sub-pixel area may be removed, thereby improving panel luminance and thus implementing a low-power display device.

Further, the display device according to an embodiment of the present disclosure has a robust structure of the cathode electrode layer that effectively absorbs the laser heat, as described above, the encapsulation function is further improved. Therefore, a separate capping layer and/or passivation layer disposed on top of the cathode electrode layer so as to block the inflow of oxygen and moisture from the outside may be omitted, thereby reducing an overall thickness of the display device and thus providing a slim display device. Further, process efficiency improvement and cost reduction effects due to the omission of the capping layer and/or the passivation layer are advantageous.

According to the embodiments of the present disclosure, an overall thickness of the display device can be reduced, thereby lightening the display device according to weight reduction. In addition, additional processes can be reduced, such that process optimization can be obtained.

Effects of the present disclosure are not limited to the effects mentioned above, and other effects not mentioned will be clearly understood by those skilled in the art from the descriptions below.

DETAILED DESCRIPTION

Figure 1:
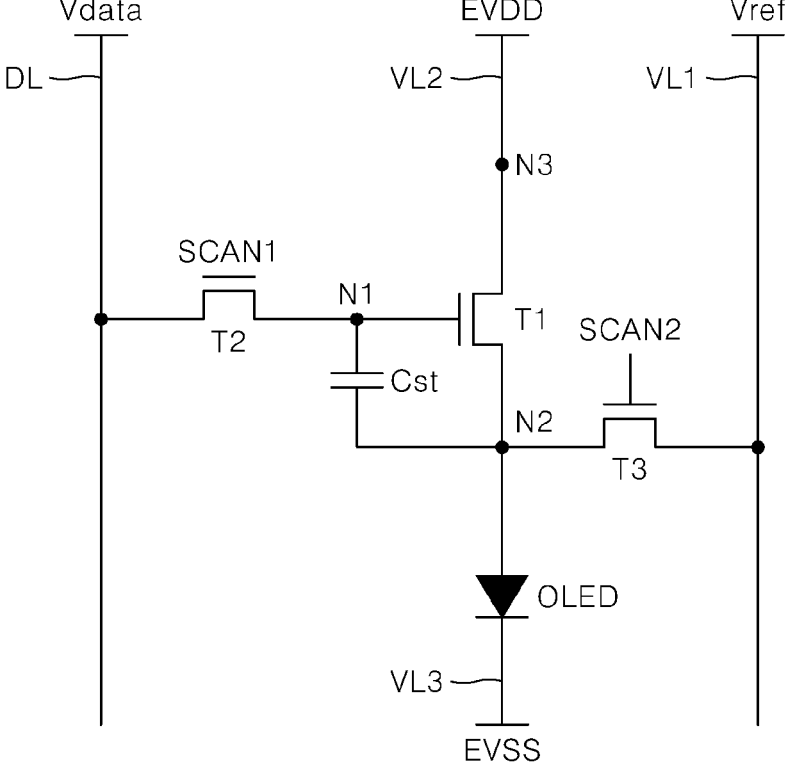
FIG. 1 is an example of a circuit diagram of a sub-pixel of a display device according to an embodiment of the present disclosure.
Figure 2:
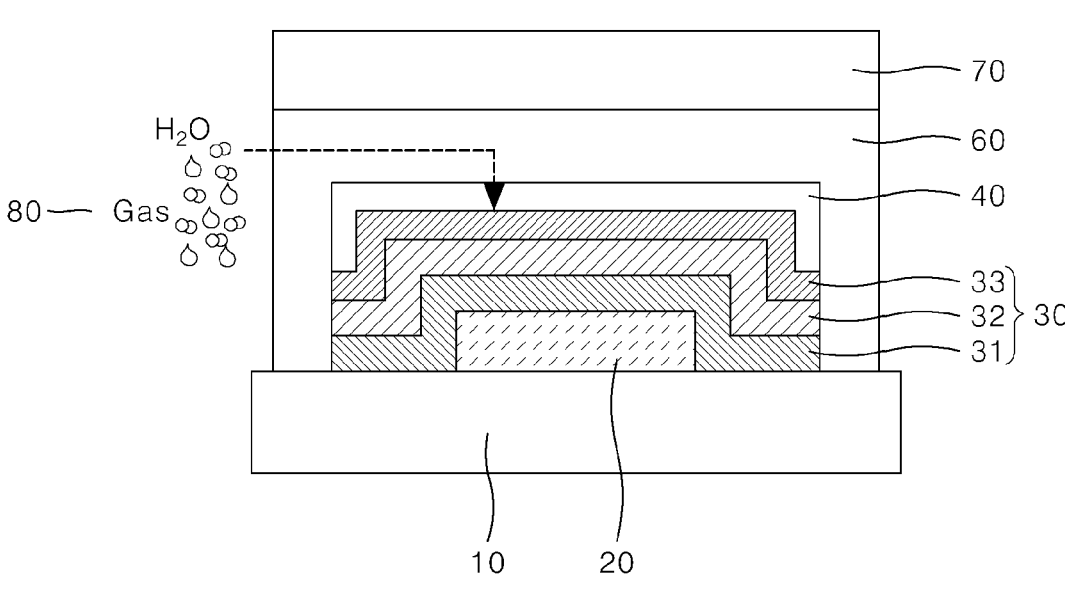
FIG. 2 is a cross-sectional view of a sub-pixel of a display device according to an embodiment of the present disclosure.
Figure 3:
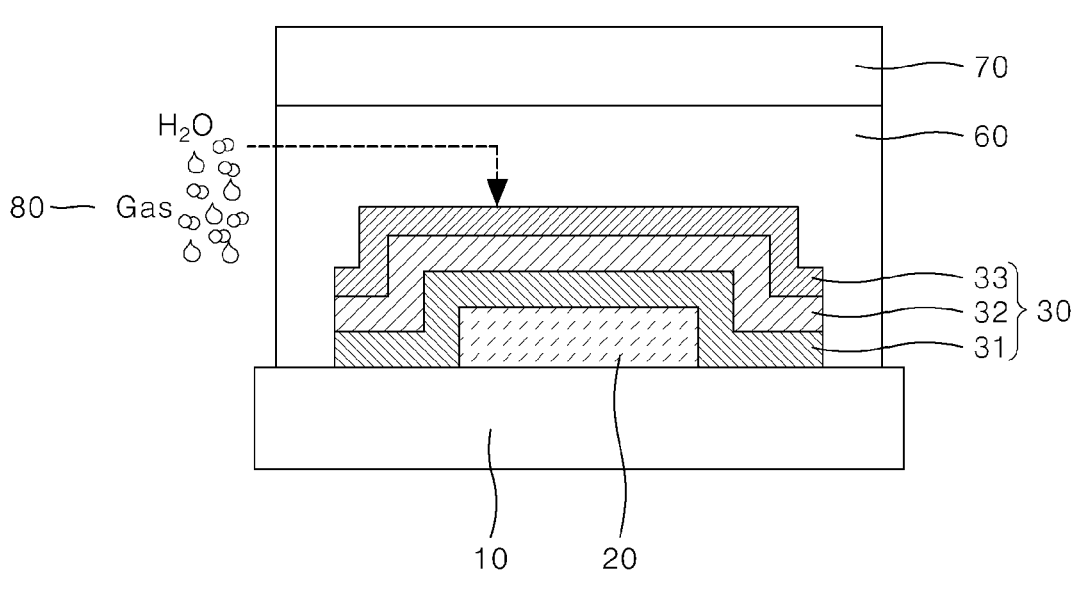
FIG. 3 is a cross-sectional view of a sub-pixel of a display device according to another embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment of the present disclosure will be described in detail with reference to FIGS. 1 to 9.

FIG. 1 is an example of a circuit diagram for a sub-pixel of a display device according to an embodiment of the present disclosure.

A display device 1 may include a plurality of sub-pixels defined by a plurality of data lines DL extending in a first direction and a plurality of gate lines GL extending in a second direction intersecting the first direction.

The sub-pixels may be implemented to emit light of the same color such as white (W) light. Alternatively, the sub-pixels may be implemented to emit light of different colors such as red (R), blue (B), and green (G).

For example, the plurality of sub-pixels may be embodied to emit a combination of red (R), blue (B), and green (G) light, or may be embodied to emit a combination of red (R), blue (B), green (G), and white (W) light.

A combination of the plurality of sub-pixels as described above may constitute one pixel.

A sub-pixel may be implemented in a top emission scheme, a bottom emission scheme, or a dual emission scheme according to a structure and a light-emission direction.

In the present disclosure, an example that the sub-pixel of the display device 1 is implemented in the bottom emission scheme in which the sub-pixel emits light toward a substrate 10 will be described.

One sub-pixel may include a light-emitting element OLED, a driving thin-film transistor T1 driving the light-emitting element OLED, a switching thin-film transistor T2 transferring a data signal to a first node N1 corresponding to a gate node of the driving thin-film transistor T1, a storage capacitor Cst, and a sensing thin-film transistor T3 disposed between and connected to a second node N2 of the driving thin-film transistor T1 and a reference voltage Vref.

The light-emitting element OLED may include an anode electrode corresponding to a pixel electrode, a light-emissive layer, and a cathode electrode corresponding to a common electrode.

For example, the light-emitting element may be embodied as an organic light-emitting diode (OLED) in which the light-emissive layer is embodied as an organic light-emissive layer.

A second power line VL2 may be electrically connected to the cathode electrode of the light-emitting element and may applying a low potential voltage EVSS thereto.

The driving thin-film transistor T1 may supply a driving current to the light-emitting element to drive the light-emitting element.

Source and drain electrodes of the driving thin-film transistor T1 may be disposed between and connected to a second power line VL2 applying a high potential voltage EVDD at node N3 and the second node N2, while the gate electrode of the driving thin-film transistor T1 may be connected to the first node N1.

Source and drain electrodes of the switching thin-film transistor T2 may be disposed between and may be electrically connected to a data line DL supplying a data signal Vdata and the first node N1 of the driving thin-film transistor T1, while a gate electrode of the switching thin-film transistor T2 may be connected to a gate line GL that applies a scan signal SCAN.

The switching thin-film transistor T2 may be controlled based on a first scan signal SCAN1.

The switching thin-film transistor T2 may be turned on based on the first scan signal SCAN1 to transmit the data signal Vdata supplied from the data line DL to the first node N1 of the driving thin-film transistor T1.

The storage capacitor Cst may be electrically connected to and disposed between the first node N1 and the second node N2 of the driving thin-film transistor T1.

Source and drain electrodes of the sensing thin-film transistor T3 may be disposed between and connected to the second node N2 and a first power line VL1 that applies the reference voltage Vref, while a gate electrode of the sensing thin-film transistor T3 may be connected to the gate line GL for applying a sensing signal SENSE thereto.

A second scan signal SCAN2 and the sensing signal SENSE may be separate gate signals. However, the present disclosure is not limited thereto, and the second scan signal SCAN2 and the sensing signal SENSE may not be distinguished from each other but may be the same gate signal.

Further, a separate sensing signal line SL for applying the sensing signal SENSE to the gate electrode of the sensing thin-film transistor T3 may be additionally disposed.

In the present disclosure, an example in which the sub-pixel includes a pixel driving circuit of a 3T (transistor) and 1C (capacitor) structure including the driving thin-film transistor T1, the switching thin-film transistor T2, the sensing thin-film transistor T3, and the storage capacitor Cst will be described. However, the present disclosure is not limited thereto.

As described above, various types of power lines such as the second power line VL2 for applying the high potential voltage EVDD, the third power line VL3 for applying the low potential voltage EVSS, and the first power line VL1 for applying the reference voltage Vref may be electrically connected to the sub-pixel.

For example, the sub-pixel may receive the high potential voltage EVDD and the low potential voltage EVSS required for an operation thereof from a power supply (not shown).

The high potential voltage EVDD generated in the power supply may be supplied to the anode electrode of the light-emitting element, while the low potential voltage EVSS generated in the power supply may be supplied to the cathode electrode of the light-emitting element.

Hereinafter, a display device according to each of various embodiments of the present disclosure will be described in detail with reference to FIG. 2 to FIG. 7.

A light-blocking layer 11 may be disposed on the substrate 10 so as to block external light from being incident on a semiconductor layer of the thin-film transistor.

The light-blocking layer 11 and the data line DL and may be formed in the same process and may be disposed in the same layer and may be made of the same material.

Further, the light-blocking layer 11 and the second power line VL2 applying the high potential voltage EVDD may be formed in the same process and may be disposed in the same layer and may be made of the same material.

The light-blocking layer 11 may be embodied as a metal layer composed of one or more layers. In one example, the light-blocking layer 11 may be embodied as a double layer such as a Cu layer/a MoTi layer. However, the present disclosure is not limited thereto.

A buffer layer 12 may be disposed on the light-blocking layer 11.

The buffer layer 12 may be embodied as an inorganic material layer composed of one or more layers. In one example, the buffer layer 12 may be embodied as a stack in which a plurality of silicon oxide ($SiO_2$) layers and silicon nitride (SiNx) layers may be alternately stacked on top of each other. However, the present disclosure is not limited thereto.

A gate insulating layer 13 made of an inorganic material such as silicon oxide ($SiO_2$) may be disposed on the buffer layer 12.

A gate electrode layer 14 of a thin-film transistor may be disposed on the gate insulating layer 13.

The gate electrode layer 14 and the first power line VL1 applying the reference voltage Vref may be formed in the same process, and may be disposed in the same layer and may be made of the same material.

The gate electrode layer 14 may be embodied as a metal layer composed of one or more layers. In one example, the gate electrode layer 14 may be embodied as a double layer such as a Cu layer/a MoTi layer. However, the present disclosure is not limited thereto.

An interlayer insulating layer 15 made of an inorganic material such as silicon oxide ($SiO_2$) may be disposed on the gate electrode layer 14.

A color filter layer 16 may be disposed on the interlayer insulating layer 15.

For example, in an area corresponding to each sub-pixel, a first color filter layer 16R corresponding to a first color, a second color filter layer 16B corresponding to a second color, and a third color filter layer 16G corresponding to a third color may be disposed.

In the present disclosure, the first color filter layer 16R may corresponds to a red color (R), the second color filter layer 16B may correspond to a blue color (B), and the third color filter layer 16G may correspond to a green color (G).

An overcoat layer 17 made of an organic material may be disposed on the color filter layer 16.

An anode electrode layer 18 may be disposed on the overcoat layer 17.

The anode electrode layer 18 may be a transparent layer made of a transparent conductive oxide such as indium tin oxide (ITO) or indium zinc oxide (IZO).

On the anode electrode layer 18, a bank layer 19 functioning as a pixel defining layer defining each sub-pixel may be disposed.

The bank layer 19 may define a boundary between sub-pixels emitting light of different colors and may prevent color mixing therebetween.

An organic light-emissive layer 20 may be disposed on the bank layer 19.

The organic light-emissive layer 20 may be embodied as a light-emissive layer (EML) that emits red (R), blue (B), or green (G) light on a sub-pixel basis. However, the present disclosure is not limited thereto, and the organic light-emissive layer 20 may be embodied as a light-emissive layer emitting white (W) color light.

When the organic light-emissive layer 20 emits the white (W) color light, the red (R), blue (B), or green (G) color may be rendered using the color filter layer 16.

The light-emissive layer may be made of a phosphorescent material or a fluorescent material. A specific material thereof is not particularly limited.

The organic light-emissive layer 20 may be formed as a single layer.

However, the present disclosure is not limited thereto and the organic light-emissive layer 20 may be formed as a plurality of layers.

When the organic light-emissive layer 20 is formed as the plurality of layers, the organic light-emissive layer 20 may be implemented in a tandem structure in which one or more charge generation layers CGL are disposed between adjacent organic light-emissive layers 20.

The charge generation layer may be embodied as an N-type charge generation layer N-CGL or a P-type charge generation layer P-CGL.

The N-type charge generation layer N-CGL and the P-type charge generation layer P-CGL may serve to adjust charge balance between the plurality of organic light-emissive layers 20.

The N-type charge generation layer N-CGL serves to help inject electrons into the organic light-emissive layer 20 located under the N-type charge generation layer N-CGL. The P-type charge generation layer P-CGL serves to help inject holes into the organic light-emissive layer 20 located on top of the P-type charge generation layer P-CGL.

For example, the N-type charge generation layer N-CGL which serves to help inject electrons into the organic light-emissive layer 20 may be made of an alkali metal, an alkali metal compound, or an organic material or a compound thereof that serves to help inject electrons into the organic light-emissive layer 20.

A lifetime of the light-emissive layer may be improved by adjusting the LUMO level of a host included in the N-type charge generation layer N-CGL and the LUMO level of the electron transport layer ETL.

The N-type charge generating layer N-CGL may include the host and at least one material doped into the host, wherein the doped material may be selected from an alkali metal such as lithium (Li), sodium (Na), potassium (K), or cesium (Cs), or an alkaline earth metal such as magnesium (Mg), strontium (Sr), barium (Ba), or radium (Ra), Liq, and an n-type dopant.

The P-type charge generation layer P-CGL may be located on the N-type charge generation layer N-CGL.

A host material of the P-type charge generation layer P-CGL which serves to help inject holes into the organic light-emissive layer 20 may be made of the same material as a material of the hole injection layer HIL and the hole transport layer HTL. A p-type dopant made of a p-type material may be doped into the host material.

A cathode electrode layer 30 may be disposed on the organic light-emissive layer 20.

The cathode electrode layer 30 may be formed as an integral electrode layer, for example, a surface electrode layer covering all of the plurality of sub-pixels. However, the present disclosure is not limited thereto.

An electron transporting layer (ETL) and/or an electron injection layer (EIL) may be additionally disposed between the organic light-emissive layer 20 and the cathode electrode layer 30. However, the present disclosure is not limited thereto.

The cathode electrode layer 30 may be composed of a plurality of layers including a conductive organic material layer.

For example, the cathode electrode layer 30 may include a pair of metal layers and the conductive organic material layer interposed therebetween.

Specifically, the cathode electrode layer 30 may include a first electrode layer 31, a second electrode layer 32, and a third electrode 33 sequentially stacked in an upward direction.

In the present disclosure, "layers being sequentially stacked" means an order in which the layers are stacked, and does not exclude that an additional layer is disposed between the layers.

The first electrode layer 31 may be embodied as a metal layer having high reflectivity.

For example, the first electrode layer 31 may include aluminum (Al) or silver (Ag). However, the present disclosure is not limited thereto.

The second electrode layer 32 may be a conductive organic material layer.

For example, the second electrode layer 32 may include an organic material doped with a metal or an n-type dopant.

In one example, the second electrode layer 32 may be a charge generation layer CGL, or may be the N-type charge generation layer N-CGL.

The third electrode layer 33 may be a metal layer.

For example, the third electrode layer 33 may include aluminum (Al), and accordingly, may include the same metal having high reflective efficiency as that of the first electrode layer 31.

However, the present disclosure is not limited thereto, and the third electrode layer 33 may include other metals capable of being evaporated or sputtered.

In one example, the third electrode layer 33 may include one or more metals of copper (Cu), molybdenum (Mo), tungsten (W), titanium (Ti), and tantalum (Ta), or an alloy thereof.

Alternatively, the third electrode layer 33 may be a conductive oxide layer.

For example, the conductive oxide layer may be made of indium-tin-oxide (ITO), indium-zinc-oxide (IZO), or indium-gallium-zinc-oxide (IGZO).

On the cathode electrode layer 30, a capping layer 40 may be disposed so as to prevent or at least reduce external defect-causing factors 80 such as moisture ($H_2O$), gas, and oxygen ($O_2$) from invading the organic light-emissive layer 20.

The capping layer 40 may include one or more layers made of an organic material or an inorganic material.

A passivation layer 50 made of an inorganic material may be additionally disposed on the capping layer 40. The passivation layer 50 together with the capping layer 40 may prevent or at least reduce the external defect-causing factors 80 from invading the organic light-emissive layer 20.

An encapsulation layer 70 may be additionally disposed on the passivation layer 50 so as to further increase encapsulation reliability of the display device 1. The encapsulation layer 70 may be fixed to the passivation layer 50 via the adhesive layer 60.

For example, when the capping layer 40 and/or the passivation layer 50 are formed, the adhesive layer 60 directly contacts the capping layer 40 or the passivation layer 50 so as to fix the encapsulation layer 70 thereto. When the capping layer 40 and the passivation layer 50 are not formed, the adhesive layer 60 may directly contact the cathode electrode layer 30 so as to fix the encapsulation layer 70 thereto.

When a defective pixel occurs in the display device 1, a repair process using laser cutting that breaks the electrical connection to the pixel may be performed in order to convert the defective pixel to a dark spot.

A repair area LR where the laser cutting process is performed may include various areas.

Figure 4:
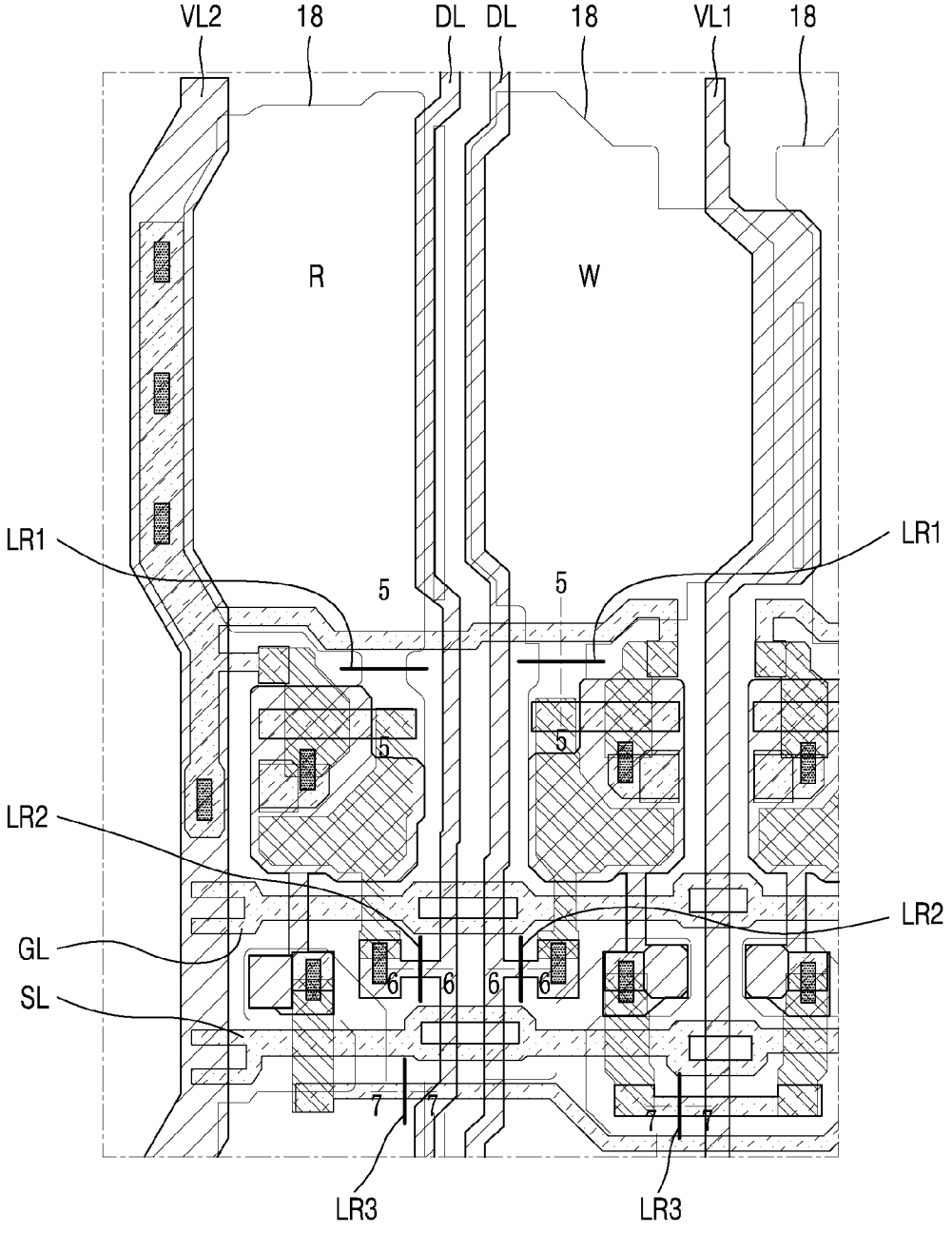
FIG. 4 is a plan view of some sub-pixels of a display device according to an embodiment of the present disclosure.
Figure 5:
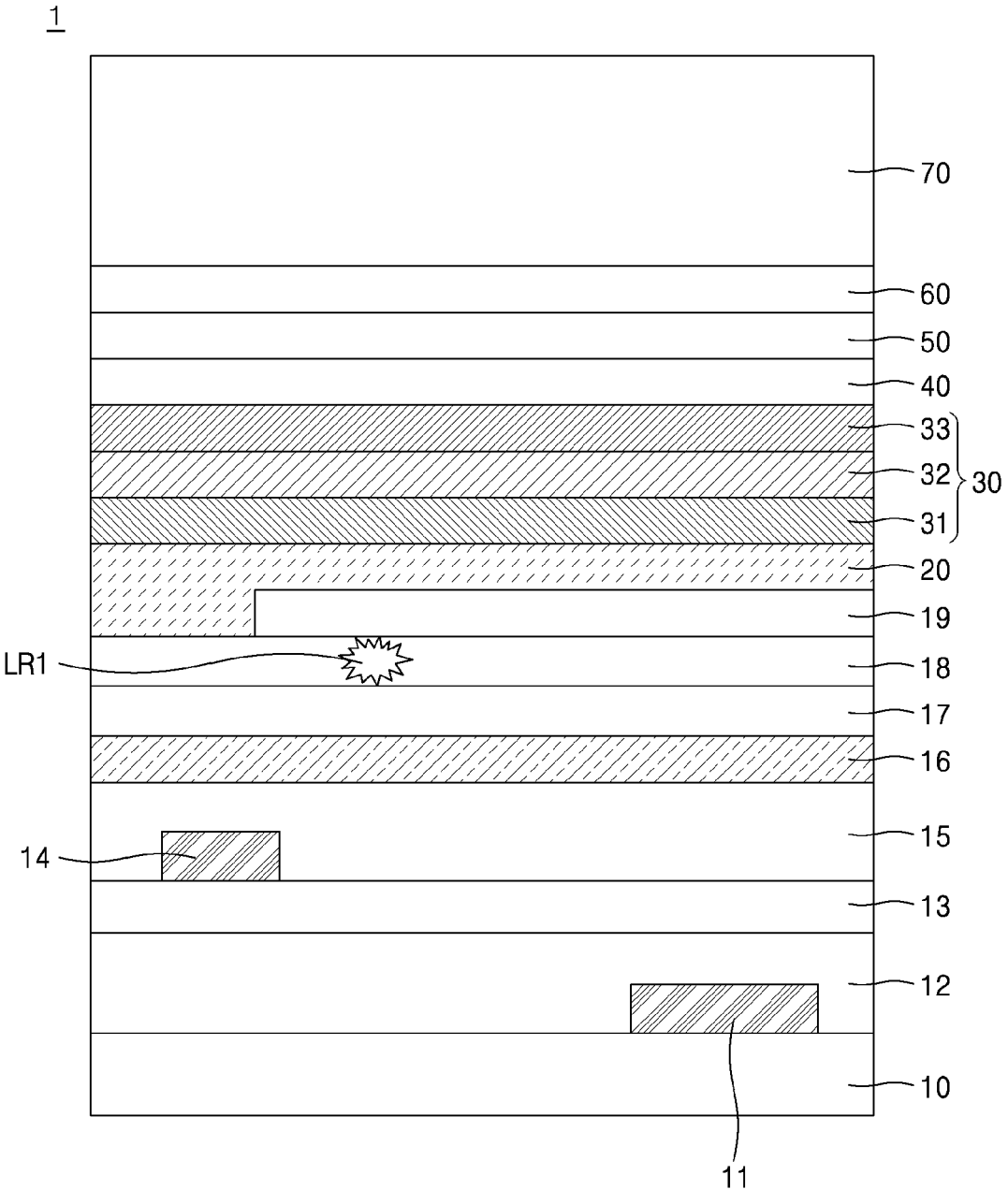
FIG. 5 is a cross-sectional view corresponding to a repair area of an anode electrode of a display device according to an embodiment of the present disclosure.

For example, referring to FIG. 4 and FIG. 5, electrical connection of the anode electrode layer 18 may be broken in a first repair area LR1.

Figure 6:
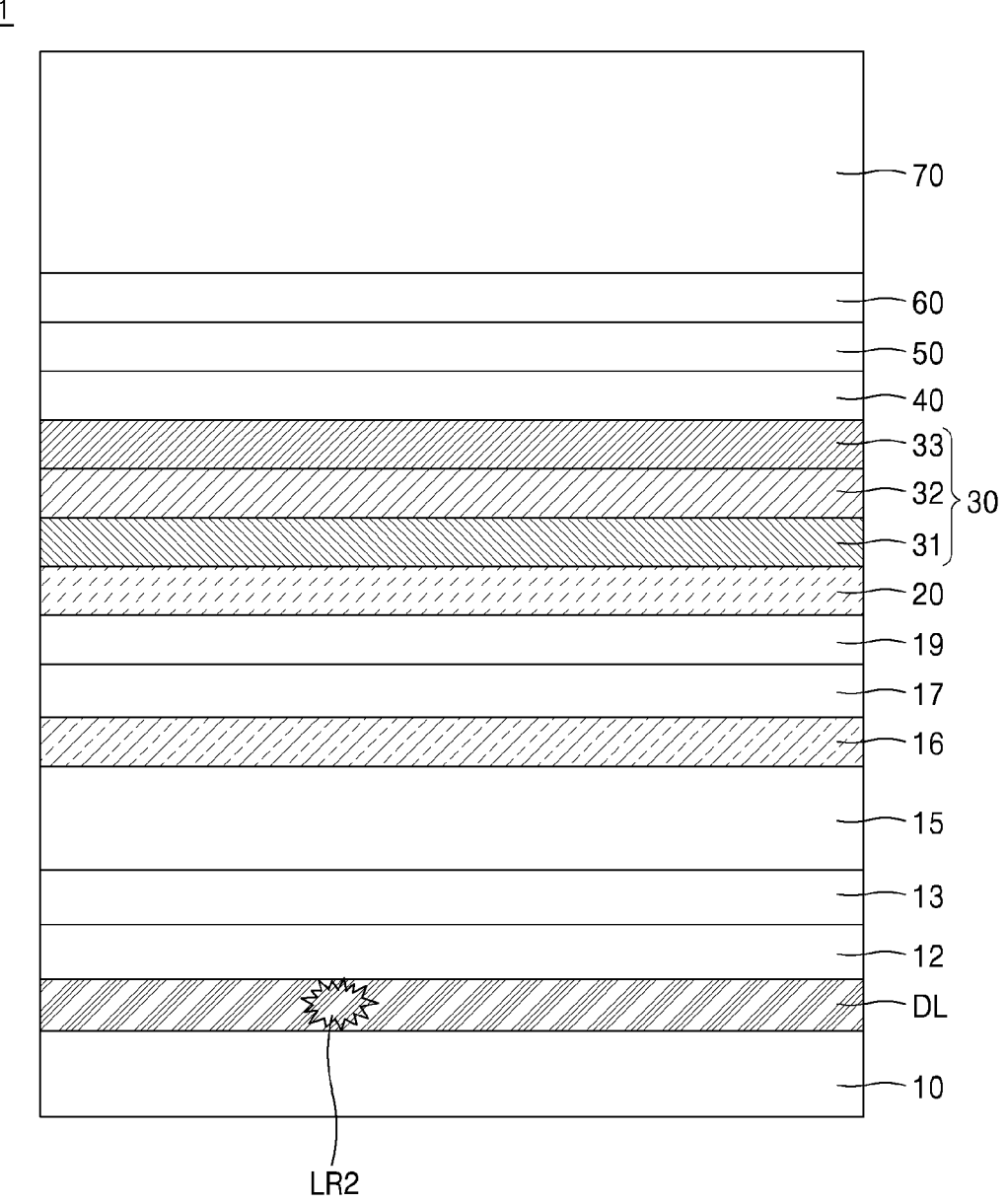
FIG. 6 is a cross-sectional view corresponding to a repair area of a data line of a display device according to an embodiment of the present disclosure.

Further, referring to FIG. 4 and FIG. 6, electrical connection of the data line DL may be broken in a second repair area LR2.

In this case, breaking the electrical connection of the data line DL may include not only breaking the electrical connection of the data line DL itself, but also breaking the electrical connection of a data auxiliary line electrically connected to the data line DL.

Figure 7:
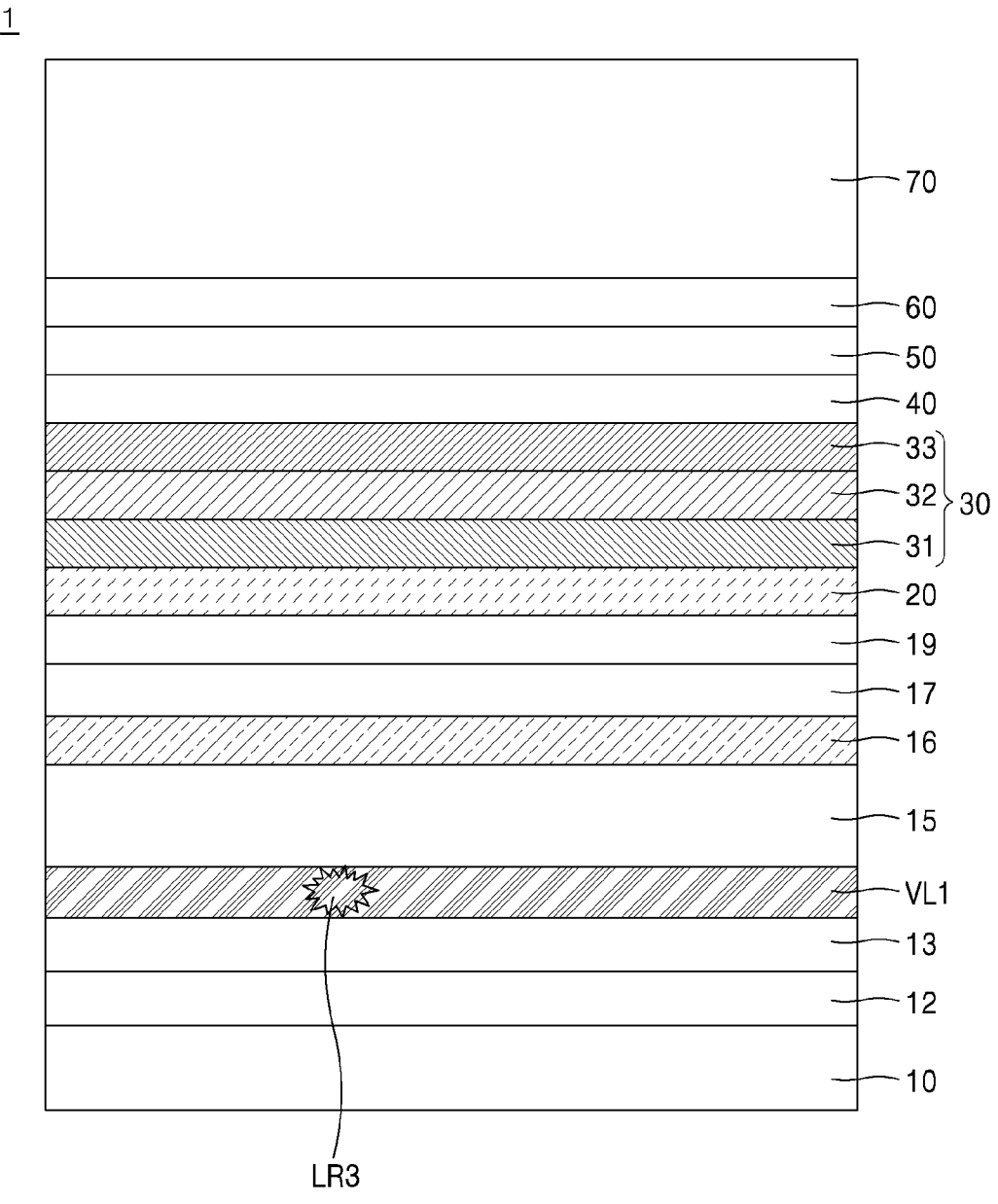
FIG. 7 is a cross-sectional view corresponding to a repair area of a power line of a display device according to an embodiment of the present disclosure.

Further, referring to FIG. 4 and FIG. 7, electrical connection of the first power line VL1 may be broken in a third repair area LR3.

In this case, breaking electrical connection of the first power line VL1 may include not only breaking electrical connection of the first power line VL1 itself, but also breaking electrical connection of a first power auxiliary line electrically connected to the first power line VL1.

Figure 8:
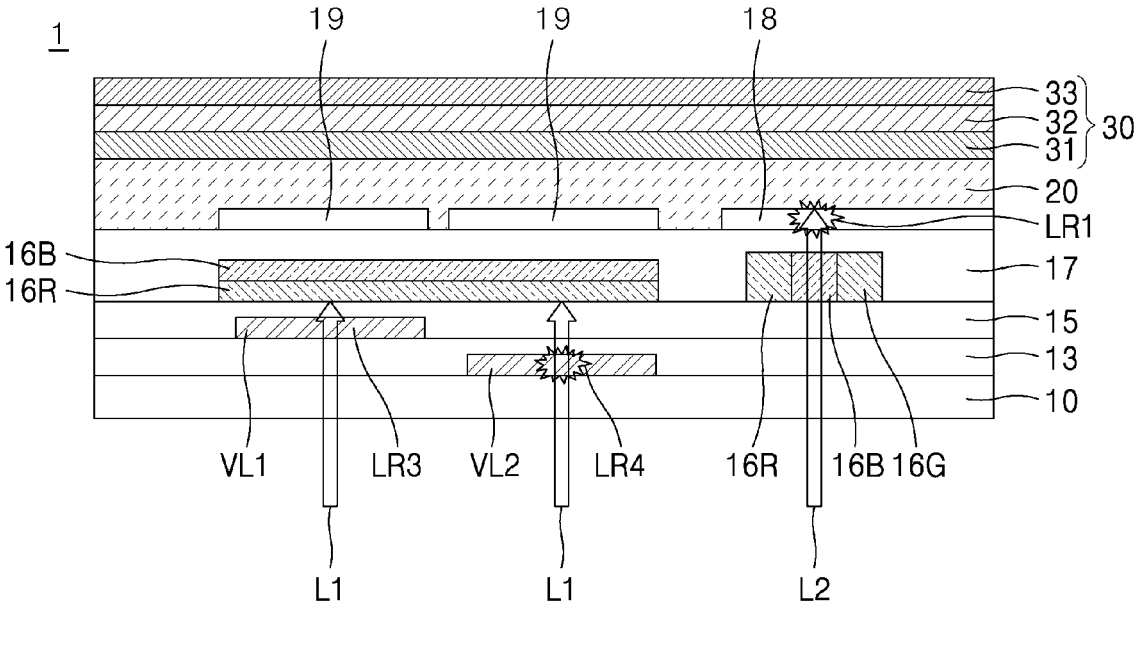
FIG. 8 is a cross-sectional view showing that a color filter layer is disposed between an organic light-emissive layer and power lines in a display device according to an embodiment of the present disclosure.

Further, referring to FIG. 8, the electrical connection of the second power line VL2 may be broken in a fourth repair area LR4.

In this case, breaking electrical connection of the second power line VL2 may include not only breaking electrical connection of the second power line VL2 itself, but also breaking electrical connection of a second power auxiliary line electrically connected to the second power line VL2.

Referring to FIG. 8, the laser for the laser cutting process may be irradiated upwardly of the substrate 10 through the substrate 10.

When the laser cutting process is performed in the various repair areas LR as described above, the cathode electrode layer 30 may be damaged due to the heat of the laser.

When the cathode electrode layer 30 is damaged in this way, the defect-causing factor 80 may invade the organic light-emissive layer 20 through the damaged cathode electrode layer 30.

However, in the display device 1 according to an embodiment of the present disclosure, the second electrode layer 32 as the conductive organic material layer included in the cathode electrode layer 30 can absorb heat from the laser.

Therefore, the third electrode layer 33 located on an opposite surface of the second electrode layer 32 to a surface of the second electrode layer 32 facing the laser irradiation source may not be directly exposed to the laser. Further, the second electrode layer 32 absorbs the heat of the laser. Thus, the damage to the third electrode layer 33 can be greatly reduced.

That is, the first electrode layer 31 may be damaged by the laser, whereas the third electrode layer 33 may not be damaged by the laser.

In this way, the damage to the second electrode layer 32 as the outermost layer of the cathode electrode layer 30 due to the laser may be reduced. Thus, the penetration of the external defect-causing factors 80 into the organic light-emissive layer 20 through the second electrode layer 32 may be reduced.

Thus, the display device 1 according to an embodiment of the present disclosure has the robust structure of the cathode electrode layer 30 to reduce the defect occurrence resulting from the deterioration of the organic light-emissive layer 20, thereby reducing progressive dark spot defect occurrence of the display device 1.

Further, in the display device 1 according to an embodiment of the present disclosure, the second electrode layer 32 may absorb the heat from the laser to reduce the damage to the third electrode layer 33. Thus, even when the first electrode layer 31 is damaged by the laser, the cathode electrode layer 30 may function normally due to the stack structure of the conductive second electrode layer 32 and the conductive third electrode layer 33.

For example, the first electrode layer 31 is closer to a laser source position than the second electrode layer 32 is. Thus, before the second electrode layer 32 absorbs the heat of the laser, the first electrode layer 31 may be exposed to the laser and thus may be damaged.

However, the first electrode layer 31 is not the outermost layer of the cathode electrode layer 30 directly exposed to the external defect-causing factor 80. Thus, even when the first electrode layer 31 is damaged, the external defect-causing factor 80 may not pass through the first electrode layer 31.

In addition, even when the first electrode layer 31 is damaged by the laser, the damage to the third electrode layer 33 may be reduced. Thus, when the first electrode layer 31 and the third electrode layer 33 include the same metal with high reflectivity, the third electrode layer 33 may play a dominant role in allowing the cathode electrode layer 30 to provide a normal function including a function of the first electrode layer 31.

Further, the display device 1 according to an embodiment of the present disclosure, the color filter layer 16 that absorbs the heat of the specific wavelength laser may be additionally disposed in an area between the organic light-emissive layer 20 and each of the power lines VL1, VL2, and VL3 or the data line DL disposed under the organic light-emissive layer 20 corresponding to the repair area LR. Thus, the damage to the cathode electrode layer 30 caused by the laser may be further reduced.

Figure 9:
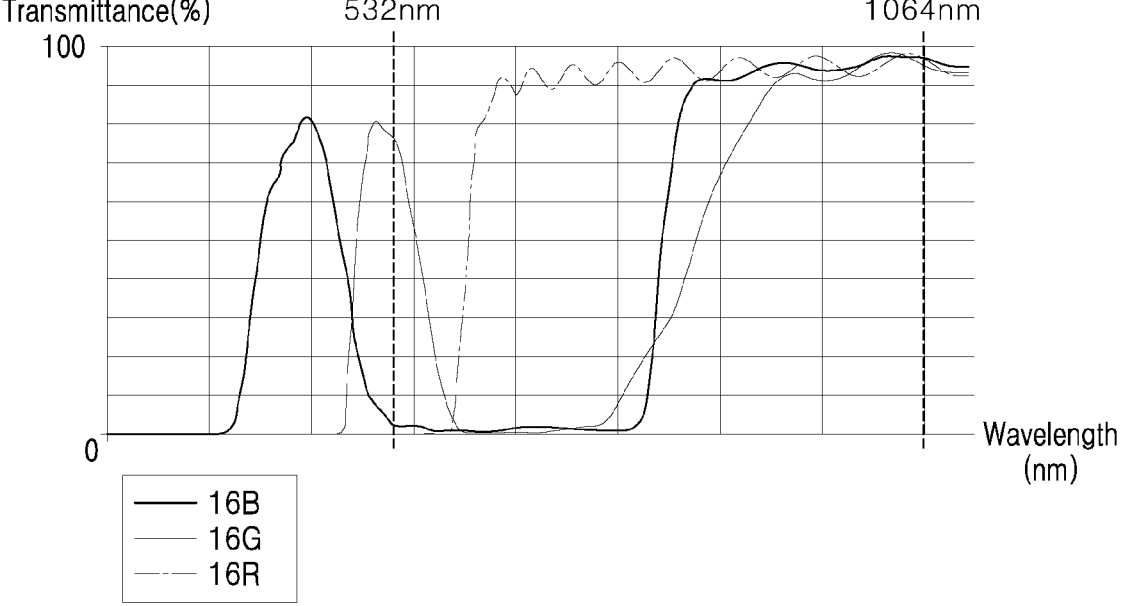
FIG. 9 shows transmittance of a color filter layer at a specific laser wavelength.

Referring to FIG. 8 and FIG. 9, the transmittance of the laser of the specific wavelength may vary depending on the color filter layer of the specific color.

For example, first wavelength laser L1 having a wavelength of 532 nm has remarkably low transmittance through each of the first color filter layer 16R corresponding the red color (R) and the second color filter layer 16B corresponding to the blue color (B). Second wavelength laser L2 having a wavelength of 1064 nm has remarkably high transmittance through each of the first color filter layer 16R corresponding the red color (R), the second color filter layer 16B corresponding to the blue color (B), and the third color filter layer 16G corresponding to the green color (G).

Accordingly, in an embodiment of the present disclosure, the color filter layer 16 may be disposed between the organic light-emissive layer 20 and each of the power lines VL1, VL2, and VL3, and/or between the organic light-emissive layer 20 and the data line DL.

In this case, the color filter layer 16 may include the first color filter layer 16R corresponding to the red color (R) and/or the second color filter layer 16B corresponding to the blue color (B) and thus may serve to absorb a certain portion of the heat from the first wavelength laser L1 having a wavelength of 532 nm.

Thus, the damage to the cathode electrode layer 30 disposed above the laser repair area of each of the power lines VL1, VL2, and VL3 or the data line DL may be reduced.

However, the second wavelength laser L2 having a wavelength of 1064 nm used for repair of the anode electrode layer 18 can substantially pass through the color filter layer 16 disposed under the anode electrode layer 18. That is, the color filter layer 16 disposed under the anode electrode layer 18 does not absorb the heat of the second wavelength laser L2 but transmits a significant portion of the second wavelength laser L2 therethrough. Thus, it is difficult to reduce the damage to the cathode electrode layer 30 disposed above the laser repair area of the anode electrode layer 18.

In this regard, the display device 1 according to an embodiment of the present disclosure has the robust structure of the cathode electrode layer 30 that effectively absorbs the heat of the laser as described above. Thus, the damage to the cathode electrode layer 30 caused by the laser may be reduced even when the color filter layer 16 formed to prevent the damage to the cathode electrode layer 30 that may occur during the laser repair process is absent.

That is, even when the color filter layer 16 is not disposed between the organic light-emissive layer 20 and each of the power lines VL1, VL2, and VL3, and/or between the organic light-emissive layer 20 and the data line DL, the damage to the cathode electrode layer 30 due to the laser may be reduced. Thus, the aperture ratio loss that may occur due to the presence of the color filter layer 16 may be removed, thereby improving panel luminance and thus implementing a low-power display device.

Further, the display device 1 according to an embodiment of the present disclosure has a robust structure of the cathode electrode layer 30 that effectively absorbs the laser heat, as described above, the encapsulation function is further improved.

Therefore, a separate capping layer 40 and/or passivation layer 50 disposed on top of the cathode electrode layer 30 so as to block the inflow of oxygen and moisture from the outside may be omitted, thereby reducing an overall thickness of the display device 1 and thus providing a slim display device 1.

Further, process efficiency improvement and cost reduction effects due to the omission of the capping layer 40 and/or the passivation layer 50 are advantageous.

A display device according to an embodiment of the present disclosure as described above may be described as follows.

A display device according to a first aspect of the present disclosure includes a substrate; an organic light-emissive layer disposed on the substrate; and a cathode electrode layer disposed on the organic light-emissive layer, wherein the cathode electrode layer includes: a first electrode layer disposed on the organic light-emissive layer; a second electrode layer disposed on the first electrode layer; and a third electrode layer disposed on the second electrode layer, wherein the second electrode layer is a conductive organic material layer.

In one implementation of the first aspect, the second electrode layer is a charge generation layer.

In one implementation of the first aspect, the charge generation layer includes an organic material doped with a metal or n-type dopant.

In one implementation of the first aspect, each of the first electrode layer and the third electrode layer is a metal layer.

In one implementation of the first aspect, the first electrode layer includes aluminum (Al) or silver (Ag), wherein the third electrode layer includes aluminum (Al).

In one implementation of the first aspect, the display device further includes a capping layer disposed on the cathode electrode layer; an adhesive layer disposed on the capping layer; and an encapsulation layer disposed on the adhesive layer, wherein the capping layer is in direct contact with the cathode electrode layer.

In one implementation of the first aspect, the display device further includes an adhesive layer disposed on the cathode electrode layer; and an encapsulation layer disposed on the adhesive layer, wherein the adhesive layer is in direct contact with the cathode electrode layer.

In one implementation of the first aspect, light emitted from the organic light-emissive layer is directed toward the substrate.

In one implementation of the first aspect, the display device further includes a power line disposed under the organic light-emissive layer; and a color filter layer disposed between the organic light-emissive layer and the power line.

In one implementation of the first aspect, a repair area of the power line is positioned in an area where the power line and the color filter layer overlap each other in a vertical direction.

In one implementation of the first aspect, the display device further includes a data line disposed under the organic light-emissive layer; and a color filter layer disposed between the organic light-emissive layer and the data line.

In one implementation of the first aspect, a repair area of the data line is positioned in an area where the data line and the color filter layer overlap each other in a vertical direction.

In one implementation of the first aspect, the color filter layer includes a red filter layer and/or a blue filter layer.

A display device according to a second aspect of the present disclosure includes a substrate; an organic light-emissive layer disposed on the substrate; and a cathode electrode layer disposed on the organic light-emissive layer, wherein the cathode electrode layer is composed of a plurality of layers including a conductive organic material layer.

In one implementation of the second aspect, the conductive organic material layer is a charge generation layer.

In one implementation of the second aspect, the plurality of layers include a pair of metal layers, and the conductive organic material layer interposed between the pair of metal layers.

In one implementation of the second aspect, the pair of metal layers include the same metal.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

What is claimed is:

1. A display device comprising:
a substrate;
an organic light-emissive layer on the substrate;
a cathode electrode layer on the organic light-emissive layer, the cathode electrode layer including:
    a first electrode layer on the organic light-emissive layer;
    a second electrode layer on the first electrode layer; and
    a third electrode layer on the second electrode layer, wherein the second electrode layer is a conductive organic material layer;
a power line under the organic light-emissive layer; and
a color filter layer between the organic light-emissive layer and the power line.

2. The display device of claim 1, wherein the second electrode layer is a charge generation layer.

3. The display device of claim 2, wherein the charge generation layer includes an organic material doped with a metal or n-type dopant.

4. The display device of claim 1, wherein each of the first electrode layer and the third electrode layer is a metal layer.

5. The display device of claim 1, wherein the first electrode layer includes aluminum or silver, and the third electrode layer includes aluminum.

6. The display device of claim 1, wherein light emitted from the organic light-emissive layer is directed toward the substrate.

7. The display device of claim 1, wherein a repair area of the power line is positioned in an area where the power line and the color filter layer overlap each other in a vertical direction.

8. A display device comprising:
a substrate;
an organic light-emissive layer on the substrate;
a cathode electrode layer on the organic light-emissive layer, the cathode electrode layer including:
    a first electrode layer on the organic light-emissive layer;
    a second electrode layer on the first electrode layer; and
    a third electrode layer on the second electrode layer, wherein the second electrode layer is a conductive organic material layer;
a capping layer on the cathode electrode layer;
an adhesive layer on the capping layer; and
an encapsulation layer on the adhesive layer, wherein the capping layer is in direct contact with the cathode electrode layer.

9. A display device comprising:
a substrate;
an organic light-emissive layer on the substrate;
a cathode electrode layer on the organic light-emissive layer, the cathode electrode layer including:
    a first electrode layer on the organic light-emissive layer;
    a second electrode layer on the first electrode layer; and
    a third electrode layer on the second electrode layer, wherein the second electrode layer is a conductive organic material layer;
an adhesive layer on the cathode electrode layer; and
an encapsulation layer on the adhesive layer, wherein the adhesive layer is in direct contact with the cathode electrode layer.

10. A display device comprising:
a substrate;
an organic light-emissive layer on the substrate;
a cathode electrode layer on the organic light-emissive layer, the cathode electrode layer including:
    a first electrode layer on the organic light-emissive layer;
    a second electrode layer on the first electrode layer; and
    a third electrode layer on the second electrode layer, wherein the second electrode layer is a conductive organic material layer;
a data line under the organic light-emissive layer; and
a color filter layer between the organic light-emissive layer and the data line.

11. The display device of claim 10, wherein a repair area of the data line is positioned in an area where the data line and the color filter layer overlap each other in a vertical direction.

12. The display device of claim 10, wherein the color filter layer includes a red filter layer and/or a blue filter layer.

13. A display device comprising:
a substrate;
an organic light-emissive layer on the substrate;
a cathode electrode layer on the organic light-emissive layer,
wherein the cathode electrode layer is composed of a plurality of layers including a conductive organic material layer;
a power line under the organic light-emissive layer; and
a color filter layer between the organic light-emissive layer and the power line.

14. The display device of claim 13, wherein the conductive organic material layer is a charge generation layer.

15. The display device of claim 13, wherein the plurality of layers include a pair of metal layers, and the conductive organic material layer is interposed between the pair of metal layers.

16. The display device of claim 15, wherein the pair of metal layers include a same metal.

* * * * *